United States Patent
Sung et al.

(10) Patent No.: US 6,302,459 B1
(45) Date of Patent: Oct. 16, 2001

(54) CONVEYANCE ARM DEVICE

(75) Inventors: Chi-Jui Sung; Chen-Chih Tsai; Yung-Hui Feng, all of Hsinchu; Guan-Jiun Liu, Chang-Hua Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/372,431

(22) Filed: Aug. 10, 1999

(30) Foreign Application Priority Data

Jan. 4, 1999 (TW) ................................. 88200047

(51) Int. Cl.[7] ............................. B25J 15/00; B65G 49/07
(52) U.S. Cl. ............................................. 294/1.1; 294/902
(58) Field of Search ................................. 294/1.1, 64.1, 294/64.3, 99.1, 99.2; 118/500, 503; 361/212, 215, 220; 414/935, 939, 941; 901/40

(56) References Cited

U.S. PATENT DOCUMENTS

| | | | |
|---|---|---|---|
| 4,496,180 | * | 1/1985 | Hillman et al. ................ 294/64.1 |
| 4,687,242 | * | 8/1987 | Rooy ................................ 294/64.1 |
| 4,736,508 | * | 4/1988 | Poli et al. ..................... 294/64.1 X |
| 5,280,979 | * | 1/1994 | Poli et al. ........................ 294/64.1 |
| 5,445,486 | * | 8/1995 | Kitayama et al. ............. 294/1.1 X |
| 5,647,626 | * | 7/1997 | Chen et al. .................... 294/1.1 X |
| 5,669,644 | * | 9/1997 | Kaihotsu et al. ................ 294/1.1 |
| 5,746,460 | * | 5/1998 | Marohl et al. ................... 294/1.1 |
| 6,024,393 | * | 2/2000 | Shamlou et al. ............. 294/1.1 X |
| 6,032,994 | * | 3/2000 | Chen et al. ...................... 294/1.1 |

FOREIGN PATENT DOCUMENTS

| | | | |
|---|---|---|---|
| 287638 | * | 12/1987 | (JP) ................................. 294/64.1 |
| 53306 | * | 2/1994 | (JP) ................................. 294/64.1 |

* cited by examiner

Primary Examiner—Johnny D. Cherry
(74) Attorney, Agent, or Firm—Thomas, Kayden, Horstemeyer & Risley

(57) ABSTRACT

A conveyance arm device for conveying wafers. The conveyance arm device comprises a conducting seat, at least a tweezer, and at least a conducting path. The conducting seat controls and drives the conveying operation of the tweezer. The tweezer comprises a first end and a second end, and a first surface and a second surface between the first and the second ends. The first end of the tweezer is connected to the conducting seat. The conducting film is adhered to the second surface of the tweezer.

13 Claims, 1 Drawing Sheet

CONVEYANCE ARM DEVICE

CROSS-REFERENCE TO RELATED APPLICATION

This application claims the priority benefit of Taiwan application serial no. 88200047, filed Jan. 4, 1999, the full disclosure of which is incorporated herein by reference.

BACKGROUND OF THE INVENTION

1. Field of Invention

The present invention relates to a conveyance apparatus. More particularly, the present invention relates to a conveyance arm device which has a function to eliminate or dispel static electricity accumulated during wafer conveyance.

2. Description of Related Art

Static electricity is a major source of wafer damage during the wafer fabrication process and after the wafer is fabricated. People walking on a carpet in a relatively high humidity ambience carry from hundreds to thousands of volts of static electricity. In an ambience with a relatively low humidity, the static voltage on the human body may be over ten thousand volts. When these charged carriers contact with wafers, the static electricity is discharged to the wafers, and thus, damages the wafers. In complementary metal-oxide semiconductor (CMOS) fabricating processes, the problem caused by the static electric discharge is especially serious.

A wafer fab is required to be a clean, dirtless environment, usually with a relatively low humidity. However, a high static electricity voltage is often generated in a wafer fab. Therefore, the equipment for wafer fabrication is usually designed to be conductive, so as to minimize the damage caused by accumulated static charges.

But many fabricating devices are still made of insulators under the consideration of fabrication cost, convenience of operation, and possibility of scratching wafers. It is known that the accumulated static electricity damages the wafers and affects the yield of the products. FIG. 1 shows a conventional conveyance arm device used in a furnace in a wafer fab for conveying wafers. The conveyance arm device comprises a conductive seat 12 and a tweezer 10. One end of the tweezer 10 is connected to the conductive seat 12. The tweezer 10 is vacuumed in order to dispose the wafers onto the tweezer 10 firmly without causing vibration or falling from the tweezer 10 during conveyance. The operation of the conducting seat 12 is controlled to drive the tweezer 10, so that the wafers are conveyed to a predetermined place by the tweezer. Generally, the tweezer 10 that conveys the wafers is made of quartz (SiC) to protect wafers from being scratched. Since quartz is not a conductor, the static charges thereon can not be timely discharged or dispelled. In addition, the wafer boat used to carry the wafers is also made of quartz. Thus, static charges are continuously accumulated, and particles in the ambience are easily absorbed onto the wafers to cause a static voltage as high as 4000V to 10000V; thus, the wafers are easily damaged, and the yield is lowered.

SUMMARY OF THE INVENTION

Accordingly, the present invention provides a conveyance arm device to convey wafers. The conveyance arm device comprises a conducting seat, at least a tweezer, and at least film. The conducting seat drives the tweezer to convey the wafers. The tweezer has a circumference comprising a first end and a second end, and a first surface and a second surface between the first and the second ends. The first end and a first part of the second surface lie on the conducting seat, while the second end is suspended. The wafers are disposed on the first surface near the second end of the tweezer. The conducting film is adhered onto a second part of the second surface and the second end of the tweezer. That is, the conducting film on the tweezer extends from the conducting seat to the second end of the tweezer to dispel static electricity accumulated thereon.

The invention effectively dispels the static electricity accumulated onto the wafers by adding a conducting film on the tweezer.

Additionally, the conducting film and the tweezer of the conveyance arm device may be replaced by a conducting glass plate. The conducting glass plate has one end connected to the conducting seat and the other end suspended in air so that the static electricity is dispelled more effectively.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
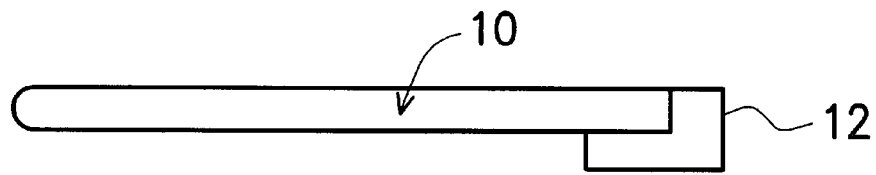
FIG. 1 shows a schematic drawing of a traditional conveyance arm.

Reference will now be made in detail to the present preferred embodiments of the invention, examples of which are illustrated in the accompanying drawings. Wherever possible, the same reference numbers are used in the drawings and the description to refer to the same or like parts.

As mentioned above, using quartz material for wafer conveyance device, static charges are easily accumulated to damage the wafers. In the invention, the quartz parts are modified and processed. By constructing a conducting path between the conducting seat and the tweezer, the static charges can be dispelled to minimize the damage of the wafers caused by the static electricity. As a consequence, the yield of product is improved.

Figure 2:
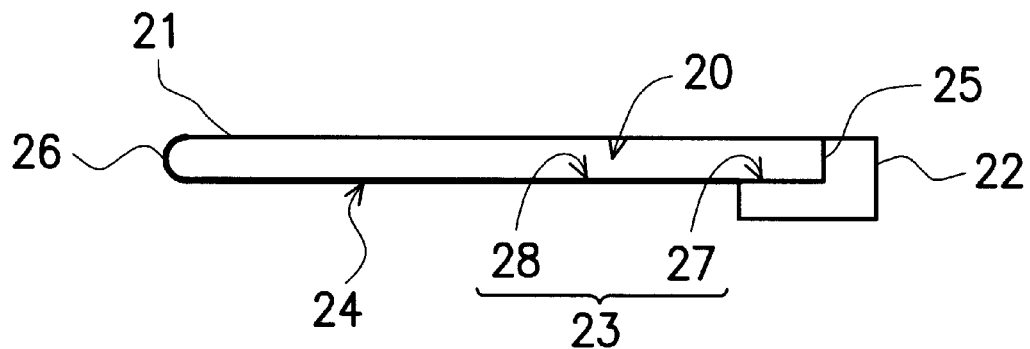
FIG. 2 shows a schematic drawing of a conveyance arm according to a preferred embodiment of the present invention.

FIG. 2 shows a schematic drawing of the conveyance arm according to a preferred embodiment of the invention. Referring to FIG. 2, a conveyance arm device comprises a conducting seat 22, a wafer carrying and conveying means, named as a tweezer 20, and a conducting film 24. The conducting seat 22 is operated to control the movement of the tweezer 20. Preferably, there are five tweezers 20 installed on the conducting seat 22, and these five tweezers 20 are arranged in an array similar in a palm shape. The tweezers 20 are made of quartz (SiC) with a first end 25 lying on the conducting seat 22 and a second end 26 suspended in air. Each of the tweezers 20 further comprises a first surface 21 and a second surface 23 between the first and the second ends 25 and 26 of the tweezers 20. As shown in the figure, a first part 27 of the second surface 23 lies on the conducting seat 22, while the first surface 21 and a second part 28 of the second surface 23 are suspended and exposed to the air. During the conveyance operation, the tweezer 20 is deflated to firmly hold wafers onto the first surface 21 near the second end 26, and preferably, the tweezer 20 is deflated to a vacuum. The conducting film 24, for example, a copper foil or a metal layer such as a tungsten or aluminum layer, is adhered or coated onto the exposed second surface 23, that is, the second part 28 of the second surface 23, and the second end 26. Therefore, a conducting path is established extending from the conducting seat to the wafers. By this design, hundreds of volts of static charges accumulated on the wafers carried by the tweezers 20 can be dispelled and eliminated through the conducting path.

Figure 3:
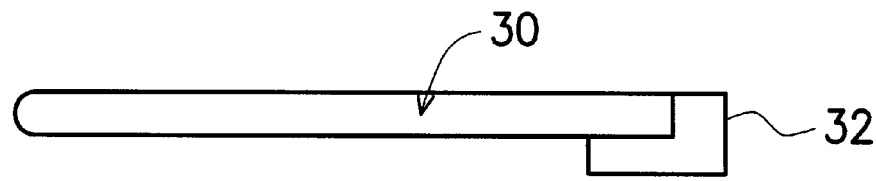
FIG. 3 shows a schematic drawing according to another preferred embodiment of the present invention.

FIG. 3 shows a conveyance arm device according to another embodiment of the invention. The conveyance arm device comprises a conducting seat 32 and a conducting glass plate 30. The conducting seat 32 drives the conducting glass plate to convey the wafers. One end of the conducting glass plate 30 connects to the conducting seat 32 for dispelling the static electricity. Preferably, the conducting glass plate 30 is made of indium tin oxide to dispelled the accumulated static electricity more efficiently.

In the invention, by adhering or coating a conducting film to the quartz-made tweezer, or by replacing the tweezer with a conducting glass plate, a conducting path is established, so that accumulated static electricity can be effectively dispelled and eliminated. The damage of wafers caused by static charges is thus minimized, and the yield of the product is improved.

It will be apparent to those skilled in the art that various modifications and variations can be made to the structure of the present invention without departing from the scope or spirit of the invention. In view of the foregoing, it is intended that the present invention shield modifications and variations of this invention provided they fall within the scope of the following claims and their equivalents.

What is claimed is:

1. A conveyance arm device used for conveying a plurality of wafers, the conveyance arm device comprises:
   a conducting seat;
   at least one tweezer, further comprising:
      a first end lying on the conducting seat; and
      a suspended second end;
      a first surface and a second surface between the first and the second ends, wherein the second surface comprises a first part near the first end lying on the conducting seat and a second part suspended and exposed; and
   a conducting film, on the exposed second part of the second surface and the second end.

2. The conveyance arm device according to claim 1, wherein the tweezer is made of quartz.

3. The conveyance arm device according to claim 1, wherein the conducting film extends from the conducting seat towards the second end of the tweezer.

4. The conveyance arm device according to claim 1, wherein the conducting film is adhered onto the tweezer.

5. The conveyance arm device according to claim 1, wherein the conducting film is coated onto the tweezer.

6. The conveyance arm device according to claim 1, wherein the conducting film comprises a copper foil.

7. The conveyance arm device according to claim 1, wherein the conducting film comprises a tungsten layer.

8. The conveyance arm device according to claim 1, wherein the conducting film comprises an aluminum layer.

9. A conveyance arm device for conveying wafers, the conveyance arm device comprising:
   a conducting seat;
   at least one wafer conveying and carrying means, with a second surface connected to the conducting seat, a first surface carrying and conveyance the wafers; and
   a conducting path, formed on the second surface of the wafer conveying and carrying means and extends to the conducting seat.

10. The conveyance arm device according to claim 9, wherein the wafer conveying and carrying means comprises one tweezer.

11. The conveyance arm device according to claim 10, wherein the conducting path comprising a conducting film.

12. The conveyance arm device according to claim 9, wherein the wafer conveying and carrying means is deflated to a vacuum status during wafer conveying operation.

13. A conveyance arm device used for conveying a plurality of wafers, the conveyance arm device comprises:
   a conducting seat;
   a tweezer, further comprising:
      a first end lying on the conducting seat; and
      a suspended second end;
   a first surface and a second surface between the first and the second ends, wherein the second surface comprising a first part near the first end lying on the conducting seat and a second part suspended and exposed; and
   a conducting film extends from the second end to the conducting seat.

* * * * *